US010712145B2

United States Patent
Chen et al.

(10) Patent No.: US 10,712,145 B2
(45) Date of Patent: Jul. 14, 2020

(54) HYBRID METROLOGY FOR PATTERNED WAFER CHARACTERIZATION

(71) Applicant: KLA-Tencor Corporation, Milpitas, CA (US)

(72) Inventors: Boxue Chen, Austin, TX (US); Andrei Veldman, Sunnyvale, CA (US); Alexander Kuznetsov, Austin, TX (US); Andrei V. Shchegrov, Campbell, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 163 days.

(21) Appl. No.: 15/787,789

(22) Filed: Oct. 19, 2017

(65) Prior Publication Data

US 2018/0112968 A1 Apr. 26, 2018

Related U.S. Application Data

(60) Provisional application No. 62/410,395, filed on Oct. 20, 2016.

(51) Int. Cl.
*G01B 11/02* (2006.01)
*G01B 15/00* (2006.01)
(Continued)

(52) U.S. Cl.
CPC .............. *G01B 11/02* (2013.01); *G01B 15/00* (2013.01); *G01N 21/9501* (2013.01);
(Continued)

(58) Field of Classification Search
CPC .... G01B 11/02; G01B 15/00; G01B 2210/56; G01N 21/9501; G01N 21/956;
(Continued)

(56) References Cited

U.S. PATENT DOCUMENTS 5,608,526 A 3/1997 Piwonka-Corle et al.
5,859,424 A 1/1999 Norton et al.
(Continued)

FOREIGN PATENT DOCUMENTS

WO 2014194095 A1 12/2014
WO 2015125127 A1 8/2015

OTHER PUBLICATIONS

International Search Report dated Dec. 22, 2017, for PCT Application No. PCT/US2017/057461 filed on Oct. 19, 2017 by KLA-Tencor Corporation, 3 pages.
(Continued)

*Primary Examiner* — John H Le
(74) *Attorney, Agent, or Firm* — Spano Law Group; Joseph S. Spano

(57) ABSTRACT

Methods and systems for evaluating the geometric characteristics of patterned structures are presented. More specifically, geometric structures generated by one or multiple patterning processes are measured by two or more metrology systems in accordance with a hybrid metrology methodology. A measurement result from one metrology system is communicated to at least one other metrology systems to increase the measurement performance of the receiving system. Similarly, a measurement result from the receiving metrology system is communicated back to the sending metrology system to increase the measurement performance of the sending system. In this manner, measurement results obtained from each metrology system are improved based on measurement results received from other cooperating metrology systems. In some examples, metrology capability is expanded to measure parameters of interest that were previously unmeasurable by each metrology system operating independently. In other examples, measurement sensitivity is improved and parameter correlation is reduced.

20 Claims, 13 Drawing Sheets

(51) Int. Cl.
  *G01N 21/95*   (2006.01)
  *G01N 21/956*  (2006.01)
  *G01N 23/225*  (2018.01)
  *G01N 23/201*  (2018.01)
  *H01L 21/66*   (2006.01)
  *G01N 23/2251* (2018.01)

(52) U.S. Cl.
  CPC ......... *G01N 21/956* (2013.01); *G01N 23/201* (2013.01); *G01N 23/2251* (2013.01); *H01L 22/12* (2013.01); *H01L 22/20* (2013.01); *G01B 2210/56* (2013.01)

(58) Field of Classification Search
  CPC .. G01N 23/201; G01N 23/2251; H01L 22/12; H01L 22/20
  USPC .... 702/81, 150, 155, 189; 356/73, 124, 400, 356/614, 625, 326; 703/6
  See application file for complete search history.

(56) References Cited

U.S. PATENT DOCUMENTS

| | | | |
|---|---|---|---|
| 6,429,943 B1 | 8/2002 | Opsal et al. | |
| 6,633,831 B2 | 10/2003 | Nikoonahad et al. | |
| 6,734,967 B1 | 5/2004 | Piwonka-Corle et al. | |
| 6,816,570 B2 | 10/2004 | Janik et al. | |
| 6,895,075 B2 | 5/2005 | Yokhin et al. | |
| 6,972,852 B2 | 12/2005 | Opsal et al. | |
| 7,478,019 B2 | 1/2009 | Zangooie et al. | |
| 7,826,071 B2 | 11/2010 | Shchegrov et al. | |
| 7,929,667 B1 | 4/2011 | Zhuang et al. | |
| 7,933,026 B2 | 4/2011 | Opsal et al. | |
| 8,142,966 B2 | 3/2012 | Izikson et al. | |
| 8,843,875 B2 | 9/2014 | Pandev | |
| 2003/0071994 A1 | 4/2003 | Borden et al. | |
| 2005/0205776 A1 | 9/2005 | Dana et al. | |
| 2013/0114085 A1 | 5/2013 | Wang et al. | |
| 2013/0158948 A1 | 6/2013 | Iloreta et al. | |
| 2014/0111791 A1 | 4/2014 | Manassen et al. | |
| 2014/0172394 A1 | 6/2014 | Kuznetsov et al. | |
| 2014/0222380 A1 | 8/2014 | Kuznetsov et al. | |
| 2014/0297211 A1 | 10/2014 | Pandev et al. | |
| 2014/0316730 A1 | 10/2014 | Shchegrov et al. | |
| 2015/0042984 A1 | 2/2015 | Pandev et al. | |
| 2015/0046118 A1 | 2/2015 | Pandev et al. | |
| 2015/0176985 A1 | 6/2015 | Shchegrov et al. | |
| 2015/0177135 A1 | 6/2015 | Amit et al. | |
| 2015/0204664 A1 | 7/2015 | Bringoltz et al. | |
| 2015/0235108 A1 | 8/2015 | Pandev | |
| 2015/0323471 A1 | 11/2015 | Sapiens et al. | |
| 2016/0025992 A1 | 1/2016 | Van Der Zouw et al. | |
| 2016/0109230 A1 | 4/2016 | Pandev et al. | |
| 2017/0018069 A1 | 1/2017 | Vaid et al. | |

OTHER PUBLICATIONS

Vaid, Alok, et al., "A holistic metrology approach: hybrid metrology utilizing scatterometry, CD-AFM, and CD-SEM,", Proc. SPIE 7971, Metrology, Inspection, and Process Control for Microlithography XXV, 797103 (Mar. 29, 2011).

|  | PRECISION [NM] | | |
| --- | --- | --- | --- |
|  | ORIGINAL | W/ DETRENDING | W/ FEEDFWD |
| 1D GRADIENT | 0.60 | 0.22 | 0.15 |
| 2D GRADIENT | 0.67 | 0.42 | 0.33 |
| 2D CANNY | 0.55 | 0.21 | 0.13 |

HYBRID METROLOGY FOR PATTERNED WAFER CHARACTERIZATION

CROSS REFERENCE TO RELATED APPLICATION

The present application for patent claims priority under 35 U.S.C. § 119 from U.S. provisional patent application Ser. No. 62/410,395, entitled "Hybrid Metrology for Patterned Wafer Characterization," filed Oct. 20, 2016, the subject matter of which is incorporated herein by reference in its entirety.

TECHNICAL FIELD

The described embodiments relate to metrology systems and methods, and more particularly to methods and systems for improved measurement of parameters characterizing the dimensions of semiconductor structures.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Multiple patterning techniques are commonly employed to increase the resolution of features printed onto the semiconductor wafer for a given lithographic system. Metrology processes are used at various steps during a semiconductor manufacturing process to detect defects on wafers to promote higher yield, including wafers manufactured using multiple patterning techniques.

Optical metrology techniques offer the potential for high throughput measurement without the risk of sample destruction. A number of optical metrology based techniques including scatterometry and reflectometry implementations and associated analysis algorithms are commonly used to characterize critical dimensions, film thicknesses, composition and other parameters of nanoscale structures.

In general, the number of parameters that need to be measured increases as the geometric complexity of the metrology target increases. This increases the risk of correlation among parameters under measurement that limits measurement performance.

In addition, optical metrology suffers low sensitivity to some parameters of metrology targets, particularly multiple patterned targets. Typically, optical metrology techniques employing physical, model based measurements require a parameterized, geometric model of the patterned structure. Example parameters include critical dimension, pitch walk, or other parameters of interest. In addition, an accurate electromagnetic model of the interaction between the optical system and the structure under measurement is required to simulate signals generated during measurement. Nonlinear regression of simulated signals against measured signals is applied to determine parameters of the modeled structure. This approach requires accurate modeling of the structure and the material properties.

Often, the measurement process suffers from weak sensitivity to critical parameters, and in some cases physical model based measurement techniques result in low sensitivity and poor precision. The lack of sensitivity of measured optical signals to these critical parameters makes it extremely difficult to monitor and control the patterning process.

In some examples, an optical metrology system is employed to measure a target. Typically, several parameters are measured, such as critical dimension (CD), $\Delta$CD, average CD, sidewall angle (SWA), and other shape parameters. Exemplary systems are described in U.S. Patent Publication No. 2015/0176985, assigned to KLA-Tencor Corporation, the contents of which are incorporated herein by reference in their entirety.

In some examples, process information associated with a wafer under measurement is communicated to an optical metrology tool to enhance the optical measurement. In one example, lithography dosage at two different patterning steps of a litho-etch-litho-etch (LELE) multiple patterning process are communicated to an optical metrology tool. If the first lithography dosage is larger than the second dosage in the LELE process, then it is known that one critical dimension parameter (CD1) will be smaller than another critical dimension parameter (CD2). By enforcing this constraint, degeneracy in the optical metrology measurement model is broken, enabling more accurate measurement results. Although process information has been shown to improve measurement results in some specific examples, there are other examples where process information is either not available or not helpful.

In some other examples, a measurement system includes two metrology techniques. Such systems are commonly referred to as "hybrid" metrology systems. Exemplary systems are described in U.S. Patent Publication No. 2017/0018069, by Alok Vaid et al., the contents of which are incorporated herein by reference in their entirety. However, measurement results obtained from prior art hybrid metrology systems typically involve determining a value of a parameter of interests based on a weighted average of measurement results from two different measurement techniques.

Metrology applications involving the measurement of patterned structures present challenges due to increasingly small resolution requirements, multi-parameter correlation, increasingly complex geometric structures, and increasing use of opaque materials. Thus, methods and systems for improved measurements are desired.

SUMMARY

Methods and systems for evaluating the geometric characteristics of patterned structures are presented herein. More specifically, geometric structures generated by one or multiple patterning processes are measured by two or more metrology systems.

In one aspect, a measurement result from one metrology system is communicated to at least one other metrology systems to increase the measurement performance of the receiving system. Similarly, a measurement result from the receiving metrology system is communicated back to the sending metrology system. In some embodiments, each metrology system determines a value of at least one parameter of interest characterizing geometric errors based at least in part on measurement results received from another metrology system. In this manner, measurement results obtained from each metrology system are improved based on measurement results received from other cooperating metrology systems. In some examples, metrology capability is expanded to measure parameters of interest that were previously unmeasurable using each metrology system independently. In other examples, measurement performance (e.g., precision and accuracy) are improved.

In one aspect, a computing system is configured as a hybrid metrology measurement engine employed to estimate values of multiple, different parameters of interest based on measurements of target structures by two or more different metrology systems. The measurement results obtained by one metrology system are used to enhance the estimation of a value of a parameter of interest by another metrology system, and vice-versa.

In a further aspect, parameter values estimated by one metrology system are re-parameterized before being utilized by another metrology system.

In another further aspect, parameter values estimated by one metrology system are transformed before being utilized by another metrology system.

In another aspect, the hybrid metrology systems and methods described herein may be applied to multiple targets.

In yet another aspect, the measurement techniques described herein can be used to provide active feedback to a process tool (e.g., lithography tool, etch tool, deposition tool, etc.). For example, values of the structural parameters determined using the methods described herein can be communicated to a lithography tool to adjust the lithography system to achieve a desired output.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Figure 1A:
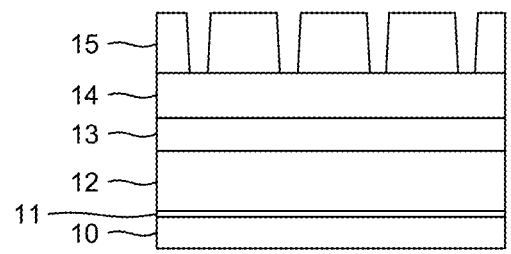
FIGS. 1A-1D depict selected steps of a double patterning lithography (DPL) technique commonly referred to as a litho-etch-litho-etch (LELE) process.
Figure 1B:
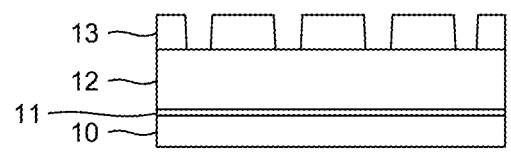
Figure 1C:
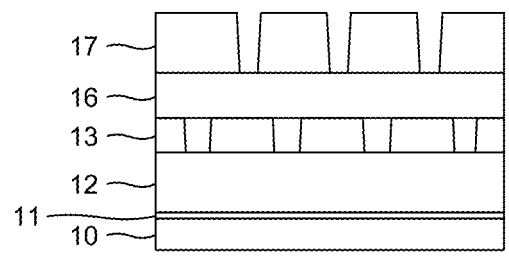
Figure 1D:
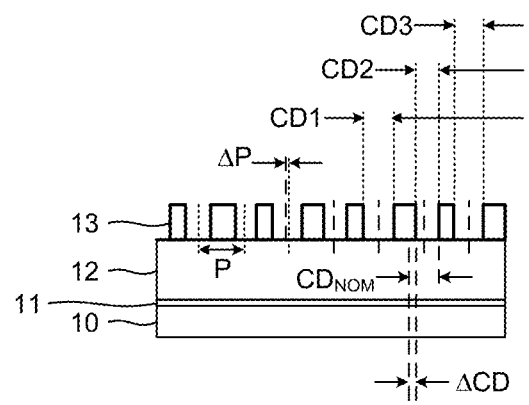

FIGS. 1A-1D depict a double patterning lithography (DPL) technique commonly referred to as a litho-etch-litho-etch (LELE) process. FIG. 1A depicts a silicon base layer 10, an interface layer such as silicon dioxide, a device layer 12, a hard mask layer 13, a sacrificial layer 14, and a patterned resist layer 15 that results from a lithography patterning step. The structure of depicted in FIG. 1A is then subjected to exposure and etch steps that result in the structure illustrated in FIG. 1B. In this structure, the pattern of resist layer 15 has been effectively transferred to the hard mask layer 13. Both the sacrificial layer 14 and the patterned resist layer 15 have been removed. A number of deposition and lithographic steps are employed to arrive at the structure illustrated in FIG. 1C. FIG. 1C illustrates another sacrificial layer 16 and patterned resist layer 17 built on top of the hard mask layer 13. Patterned resist layer 17 includes a pattern having the same pitch as the first patterned resist layer 15, and also the same pitch as the pattern etched into the hard mask layer 13. However, the patterned resist layer 17 is offset from the pattern of the hard mask layer 13 by half of the pitch of the patterned resist layer 17. The structure of depicted in FIG. 1C is then subjected to exposure and etch steps that result in the structure illustrated in FIG. 1D. In this structure, the pattern of resist layer 17 has been effectively transferred to the hard mask layer 13. Both the sacrificial layer 16 and the patterned resist layer 17 have been removed. FIG. 1D illustrates a pattern etched into hard mask 13 that is half the pitch of the patterned resist layers 15 and 17 generated by the mask of the lithographic system.

FIG. 1D also depicts the effects of a non-optimized DPL process. Ideally, the nominal pitch of the double patterned structure should be a constant value, P. However, due to imperfections in the DPL process, the pitch of the resulting structure may vary depending on location due to grating non-uniformities. This is commonly termed "pitch walk." A variation from the nominal pitch, P, is depicted as $\Delta P$ in FIG. 1D. In another example, a critical dimension of each resulting structure should be the same nominal value, $CD_{NOM}$. However, due to imperfections in the DPL process, a critical dimension (e.g., middle critical dimension, bottom critical dimension, etc.) of the resulting structure may vary depending on location (e.g., CD1, CD2, CD3). A variation of CD2 from the critical dimension, $CD_{NOM}$, is depicted as $\Delta CD$ in FIG. 1D.

Pitch walk and ΔCD are exemplary geometric errors induced by imperfections in the DPL process such as misalignment between the two lithography layers, non-uniformities in the focus and exposure of the lithographic process, mask pattern errors, etc. Both pitch walk and ΔCD introduce a unit cell that is larger than expected. Although pitch walk and ΔCD are described in particular, other multiple patterning errors may be contemplated.

Although the LELE process is described with reference to FIGS. 1A-1D, many other multiple patterning processes that induce similar errors may be contemplated (e.g., litho-litho-etch, spacer defined double patterning, etc.). Similarly, although a double patterning process is described with reference to FIGS. 1A-1D, similar errors arise in higher order patterning processes such as quadruple patterning. Typically, errors such as pitch walk and ΔCD are more pronounced in structures that result from higher order patterning processes.

Figure 2:
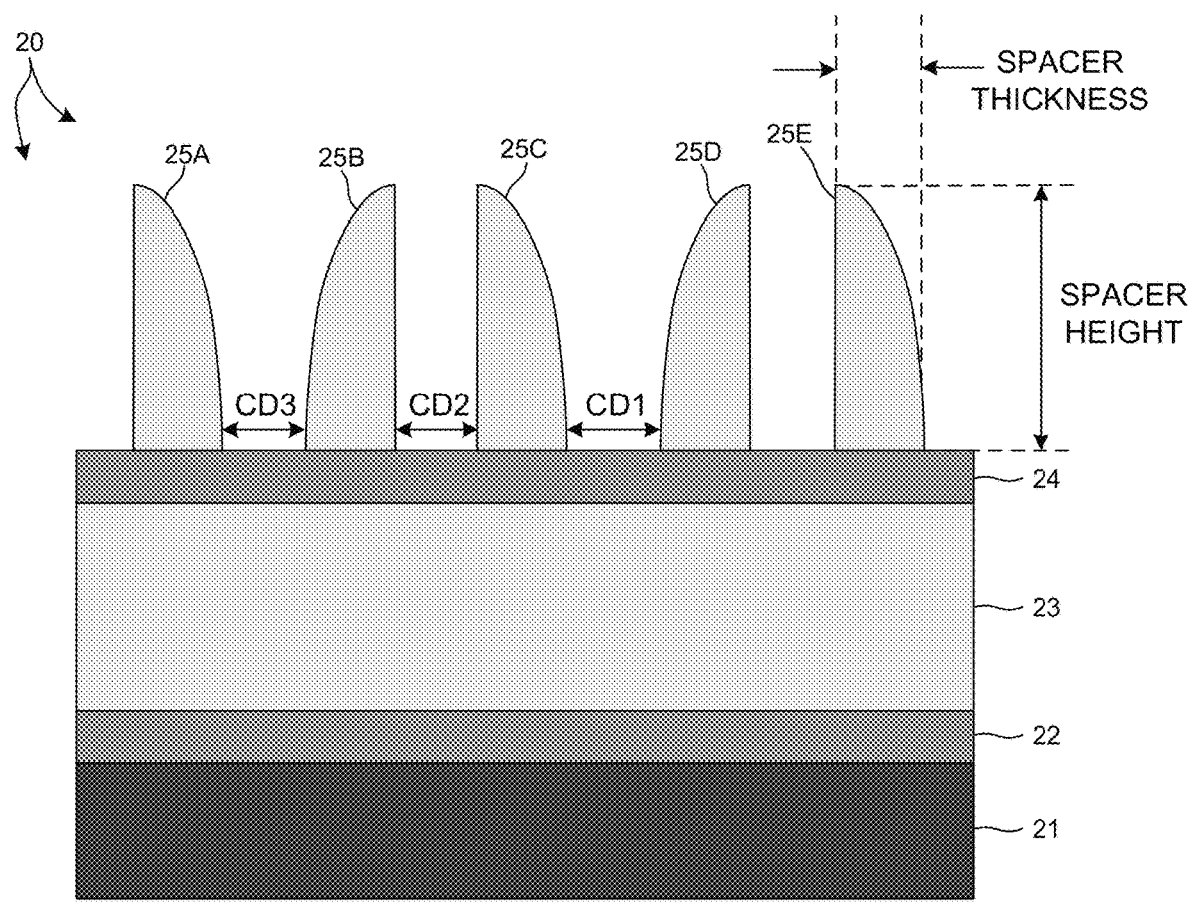
FIG. 2 depicts a semiconductor structure 20 being constructed using a self-aligned quadruple patterning (SAQP) process.

FIG. 2 depicts a semiconductor structure 20 being constructed using a self-aligned quadruple patterning (SAQP) process. FIG. 2 illustrates a process step before final etch. Semiconductor structure 20 includes a substrate layer 21, an oxide layer 22, a nitride layer 23, an oxide layer 24, and several nitride spacer structures 25A-E. Each spacer has a height and thickness. Variations in the spacing and thickness of these structures results in variations in several critical parameter values. For example, critical dimension parameters CD1, CD2, and CD3 depicted in FIG. 2 are frequently monitored because of their impact on the fin formation process, and ultimately the performance of the final structure. In addition, pitchwalk is an important parameter to both measure and control. Pitchwalk is related to CD1 and CD3 by equation (1).

$$\text{Pitchwalk} = \frac{|CD1 - CD3|}{2} \quad (1)$$

Methods and systems for evaluating the geometric characteristics of patterned structures are presented herein. More specifically, geometric structures generated by one or multiple patterning processes are measured by two or more metrology systems. Measurement results from each of the metrology systems are communicated to at least one of the other metrology systems to increase the measurement performance of the receiving system. Each receiving system determines a value of at least one parameter of interest characterizing geometric errors induced by the patterning process in accordance with the methods and systems described herein. In this manner, measurement results obtained from each metrology system are improved based on measurement results received from other cooperating metrology systems. In some examples, metrology capability is expanded to measure parameters of interest that were previously unmeasurable using each metrology system independently. In other examples, measurement performance (e.g., precision and accuracy) are improved. The methods and system described herein enable characterization of multi-patterning targets and 3D integration targets emerging within the semiconductor industry.

Figure 3:
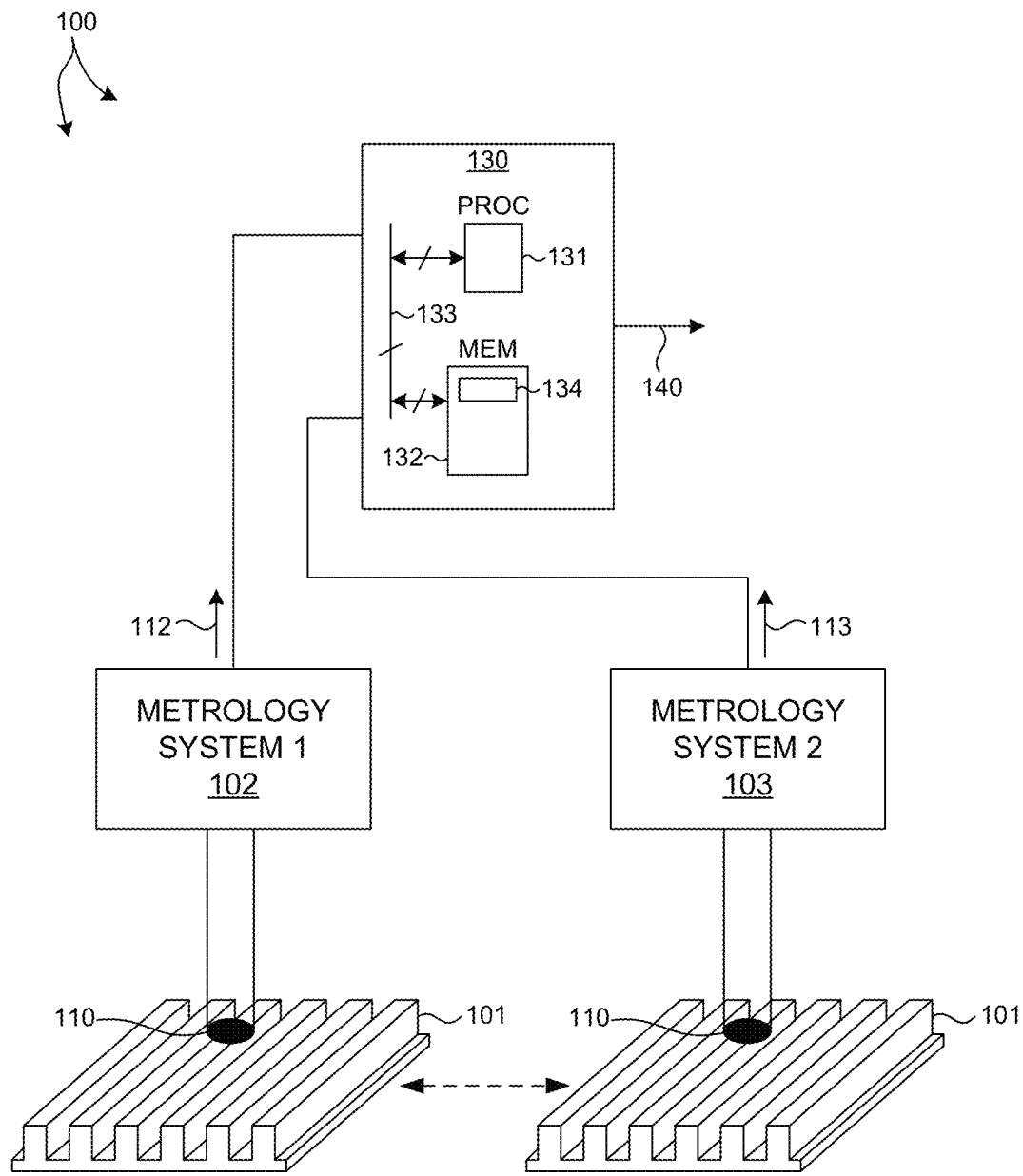
FIG. 3 depicts a hybrid metrology system 100 in one embodiment.

FIG. 3 depicts a hybrid metrology system 100 in one embodiment. As depicted in FIG. 3, hybrid metrology system 100 includes metrology systems 102 and 103 and computing system 130. Metrology systems 102 and 103 employ different, independent metrology techniques to measure the same metrology target structure disposed on a semiconductor wafer. In general, any suitable metrology systems may be contemplated within the scope of this patent document. By way of non-limiting example, any of metrology systems 102 and 103 may be configured as a SEM system, a transmission electron microscopy (TEM) system, an atomic force microscopy (AFM) system, a spectroscopic ellipsometer, a spectroscopic reflectometer, a scatterometer, an x-ray based metrology system such as a small-angle X-Ray scatterometer system, an electron beam based metrology system, an optical imaging system, etc.

In some embodiments, metrology system 102 is a scanning electron microscopy (SEM) system and metrology system 103 is an optical critical dimension (OCD) metrology system, such as a spectroscopic ellipsometry (SE) system. OCD system 102 communicates measured signals 112 to computing system 130. Measured signals 112 are indicative of SEM image information collected from measurement spot 110 of metrology target structure 101. Similarly, OCD system 103 communicates measured signals 113 to computing system 130. Measured signals 113 are indicative of measured spectra collected from measurement spot 110 of metrology target structure 101.

In one aspect, computing system 130 is configured as a hybrid metrology measurement engine employed to estimate values of multiple, different parameters of interest based on measurements of target structures by two or more different metrology systems. The measurement results obtained by one metrology system are used to enhance the estimation of a value of a parameter of interest by another metrology system, and vice-versa.

Figure 4:
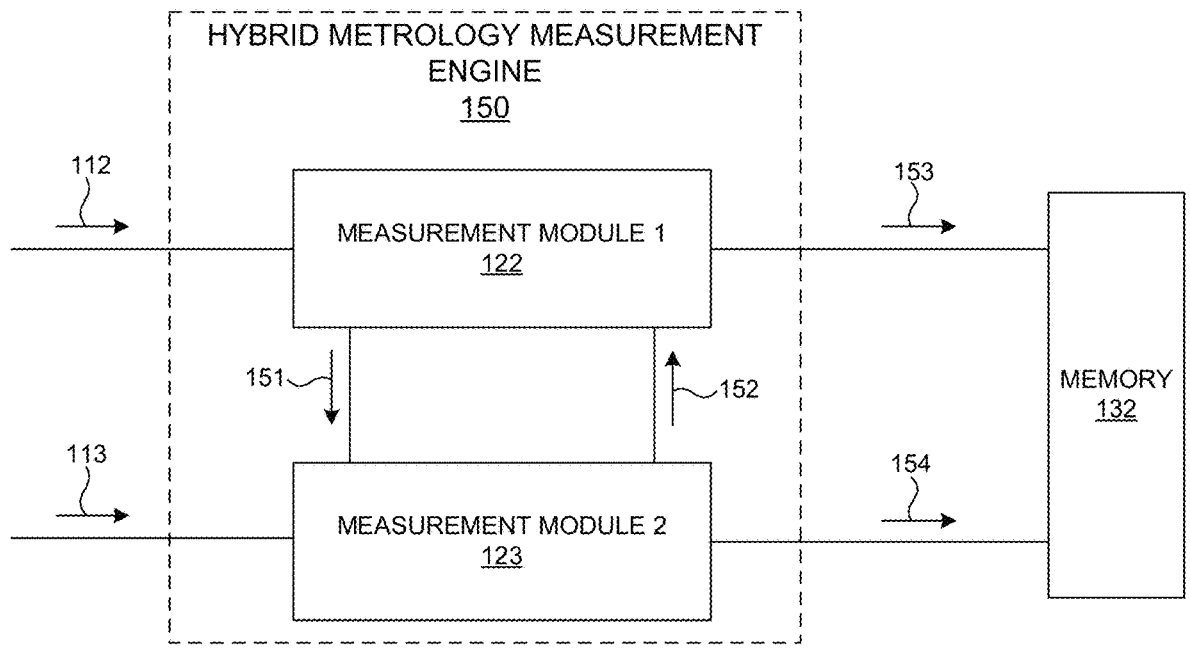
FIG. 4 is a diagram illustrative of an exemplary hybrid metrology measurement engine 150 in one embodiment.

FIG. 4 is a diagram illustrative of an exemplary hybrid metrology measurement engine 150 in one embodiment. As depicted in FIG. 4, hybrid metrology measurement engine 150 includes two different measurement modules 122 and 123, associated with metrology system 102 and 103, respectively. In one aspect, measurement results 151 obtained by measurement module 122 are communicated to measurement module 123 to improve the estimation of values 154 of one or more parameters of interest associated with the measurement of metrology structure 101 by metrology system 102. This may be referred to as a "feedforward" communication of values 151 to measurement module 123. Similarly, measurement results 152 obtained by measurement module 123 are communicated to measurement module 122 to improve the estimation of values 153 of one or more parameters of interest associated with the measurement of metrology structure 101 by metrology system 103. This may be referred to as a "feedback" communication of values 152 to measurement module 123. In general, measurement results 152 may include values 154 of the parameters of interest determined by measurement module 123. In this manner, values 154 communicated to measurement module 122 further improve the estimation of values 153. Similarly, measurement results 151 may include values 153 of the parameters of interest determined by measurement module 122. In this manner, values 153 communicated to measurement module 123 further improve the estimation of values 154.

In some embodiments, measurement results 151 may be generated by measurement module 122 and communicated to measurement module 123 before measurement results 152 are generated by measurement model 123 and communicated to measurement module 122. In some embodiments, measurement results 152 may be generated by measurement module 123 and communicated to measurement module 122 before measurement results 151 are generated by measurement model 122 and communicated to measurement module 123. In general, the process of successive feedforward and feedback communication of measurement results may be iterated several times to optimize the overall performance of both metrology systems.

As depicted in FIG. 4, measurement module 122 associated with metrology system 102 is employed to estimate values 153 of one or more parameters of interest and measurement module 123 associated with metrology system 103 is employed to estimate values 154 of a different set of one or more parameters of interest. Thus, each metrology system is employed to measure different parameters of interest. In this manner, metrology systems capable of high measurement performance with respect to particular parameters of interest are employed for that purpose.

In some embodiments, the metrology target structure 101 under measurement is a patterned structure. In these embodiments, OCD system 103 is capable of measuring the average value of geometric parameters (e.g., CD, height, SWA, FIN_CD, and pitch) with higher precision than SEM system 102. These parameters are fed forward to a measurement module associated with another metrology system, e.g., SEM system 102. SEM system 102 is capable of measuring each CD parameter value (e.g., CD1, CD2, CD3). In one aspect, each of the parameter values measured by SEM system 102 is normalized by the corresponding average values received from OCD system 103. As a result of this normalization, improved measurement performance is achieved for values such as ΔCD, ratio values such as $C_{RATIO}$, or both.

For example, the average value, $CD_{AVG}$, of CD1 and CD2 depicted in FIG. 1D is described by equation (2).

$$CD_{AVG} = \frac{CD_1 + CD_2}{2} \qquad (2)$$

However, OCD system 103 is not sensitive to some other parameters, such as ΔCD depicted in FIG. 1D. Fortunately, SEM system 102 is capable of measuring $CD_{AVG}$ and ΔCD with similar precision. In one example, measurement module 123 associated with OCD system 103 determines a value of $CD_{AVG}$ 152 and forwards the value 152 to measurement module 122 associated with SEM system 102. In turn, measurement module 122 determines a value of ΔCD 153 with higher precision based on the high precision value of $CD_{AVG}$ 152. Based on the values 152 of $CD_{AVG}$, pitch, etc., measured by measurement module 123 associated with OCD system 103, measurement module 122 associated with SEM system 102 adjusts the edge detection algorithm to operate on multiple edges simultaneously, etc., to arrive at a higher precision estimate of DCD.

In another example, measurement module 123 associated with OCD system 103 determines values 152 of sidewall angle (SWA) and height (HT). Although SWA cannot be reliably measured from SEM measurements, the value of SWA affects SEM images by broadening the edges. Based on values 152 of SWA and HT estimated by measurement module 123, measurement module 122 associated with SEM system 102 adjusts the edge detection algorithm employed to process the SEM images to arrive at an estimate of CD, DCD, etc., with higher precision and greater accuracy.

Although in this embodiment, OCD system 103 provides a high precision value 152 for $CD_{AVG}$ to SEM system 102, in general, high precision value 152 may originate from another measurement source (e.g., simulated SEM measurements, measurement with low-noise SEM images obtained with long integration time, etc.). Similarly, in this embodiment, SEM system 102 receives a high precision value 152 for $CD_{AVG}$. However, in general, a high precision value 152 may be received by any measurement system having lower precision than OCD system 103. By way of non-limiting example, metrology system 102 may be an AFM system or a TEM system.

Figure 10:
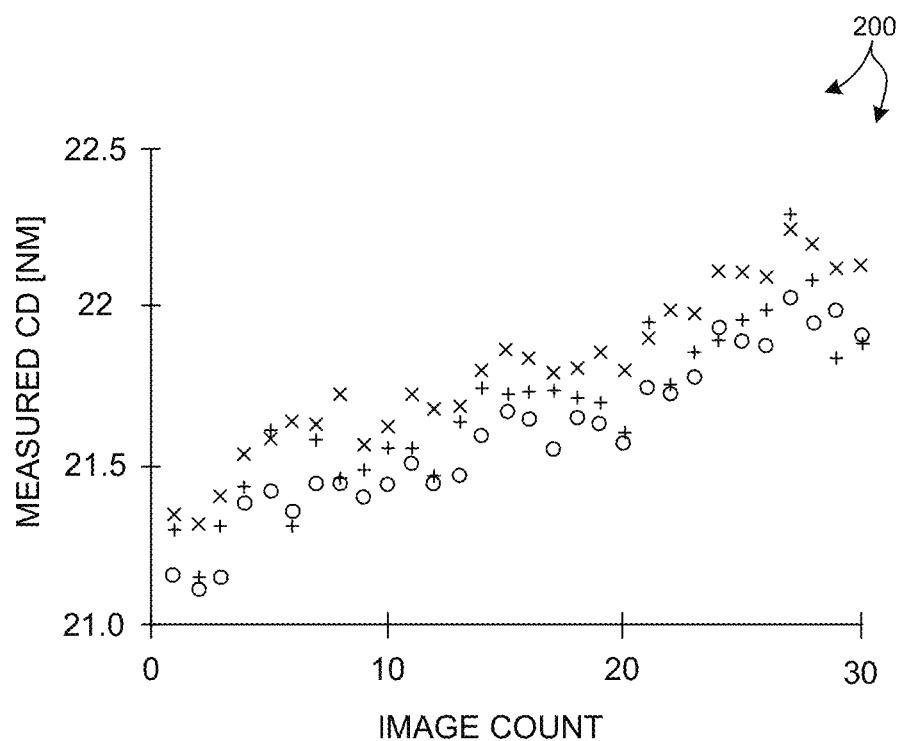
FIG. 10 depicts a plot 200 illustrative of SEM measurement performance without feed forward.

FIG. 10 depicts a plot 200 illustrative of SEM measurement performance without feed forward of a high precision value of $CD_{AVG}$. Thirty images are measured at the same target location with the same SEM system settings. For each collected image, an estimated value for a critical dimension, CD, is determined based on three different algorithms. Measurement results associated with a 1D gradient algorithm are marked "×". Measurement results associated with a 2D gradient algorithm are marked "+". Measurement results associated with a 2D Canny algorithm are marked "○".

Figure 11:
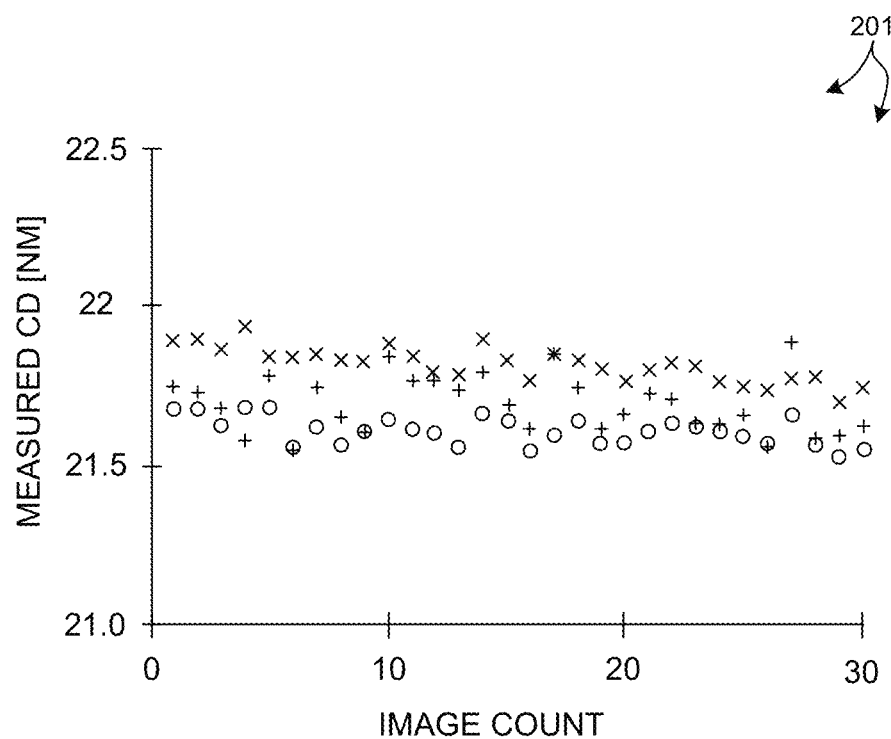
FIG. 11 depicts a plot 201 illustrative of SEM measurement performance with feed forward.

FIG. 11 depicts a plot 201 illustrative of SEM measurement performance with feed forward of a high precision value of $CD_{AVG}$. As described with reference to FIG. 10, an estimated value for a critical dimension, CD, is determined based on three different algorithms for each measured image. In this example, a ratio associated with CD1 (i.e., $CD1_{RATIO}$=(CD1/(CD1+CD2)) and a ratio associated with CD2 (i.e., $CD2_{RATIO}$=(CD2/(CD1+CD2)) are determined from the measured SEM images. $CD1_{RATIO}$ and $CD2_{RATIO}$ are normalized by the value of $CD_{AVG}$ obtained from OCD system 102 or a low noise SEM image based estimate obtained by long integration times.

As depicted in FIGS. 10 and 11, estimated values of CD vary and there is a linear trend (i.e., drift) in the estimate of CD without feedforward of a high precision value of $CD_{AVG}$. However, with feedforward of a high precision value of $CD_{AVG}$, measurement uniformity is improved and the linear trend (i.e., drift) in the estimate of CD is reduced to a negligible level.

Figures 14, 15:
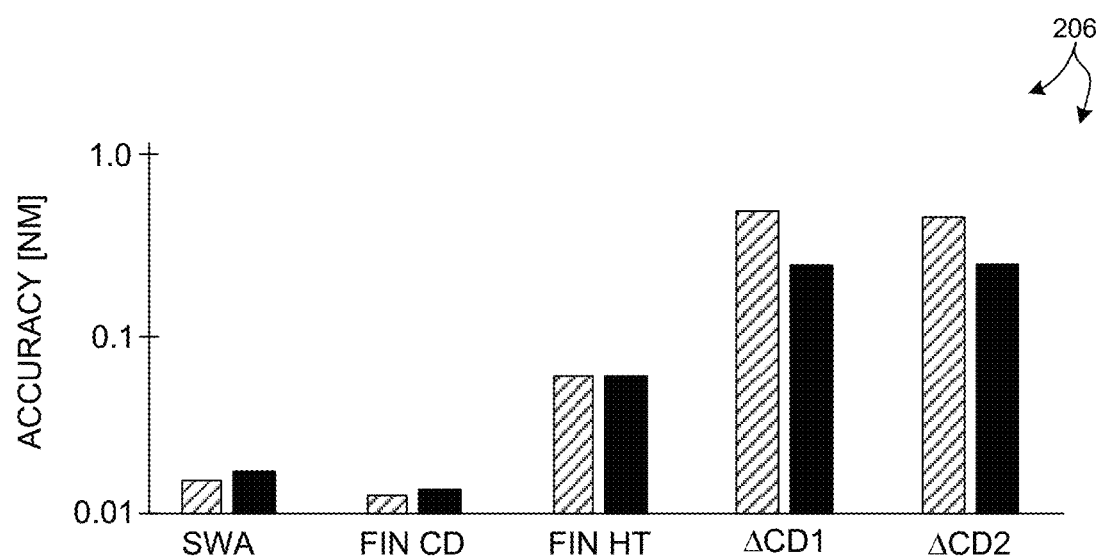
FIG. 14 depicts a table 205 of measurement precision associated with the measurements depicted in FIGS. 10 and 11.
FIG. 15 depicts a plot 206 illustrative of improved OCD measurement performance for various shape parameters based on parameter feedforward from a SEM system.

FIG. 14 depicts a table 205 of measurement precision associated with the measurements depicted in FIGS. 10 and 11. The measurement precision is calculated based on the 30 repeats for three scenarios: estimation of CD without feedforward as depicted in FIG. 10, estimation of CD without feedforward, but with linear detrending, and estimation of CD with feedforward as depicted in FIG. 11. A linear detrending process can be applied to measured data to improve precision. However, detrending is not preferred because it requires a large number of repeated images, which reduces measurement throughput.

As depicted in FIG. 14, highest precision is obtained based on the 2D Canny algorithm for all three scenarios. Precision is significantly improved with detrending, but even higher precision is obtained with feedforward of $CD_{AVG}$. As illustrated in FIG. 14, a 4× improvement in precision is obtained using feedforward compared to the identical scenario where feedforward is not utilized. In addition, feedforward offers better performance than detrending without the throughput penalty of detrending.

In another aspect, the precision improvement due to feedforward of $CD_{AVG}$ does not depend on systematic metrology offsets. It is expected that estimated values of a parameter of interest based on one metrology system are systematically offset from estimated values of the same parameter of interest based on another metrology system. In conventional hybrid metrology systems, this systematic offset may have a deleterious effect on measurement results.

Figure 12:
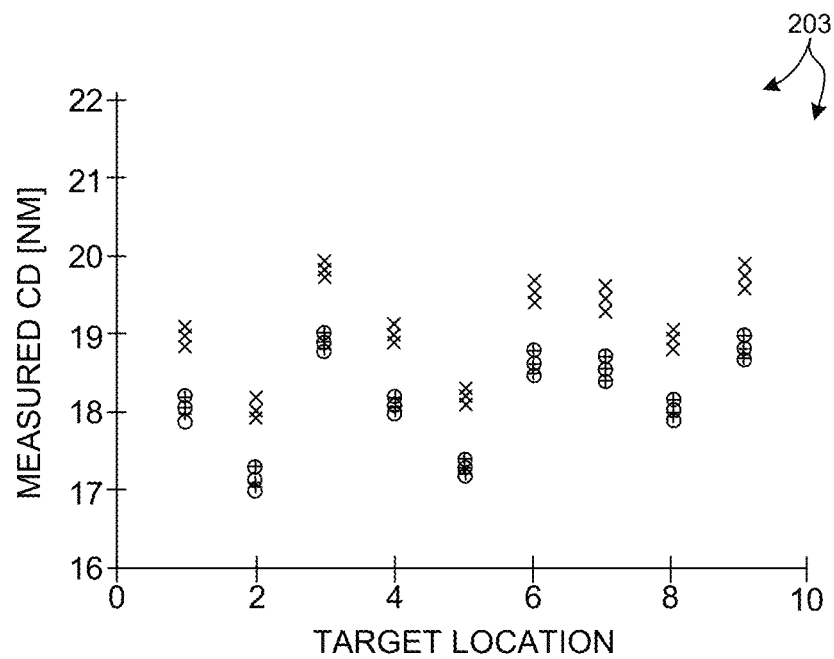
FIG. 12 depicts a plot 203 illustrative of CD values estimated from SEM images at different target locations.
Figure 13:
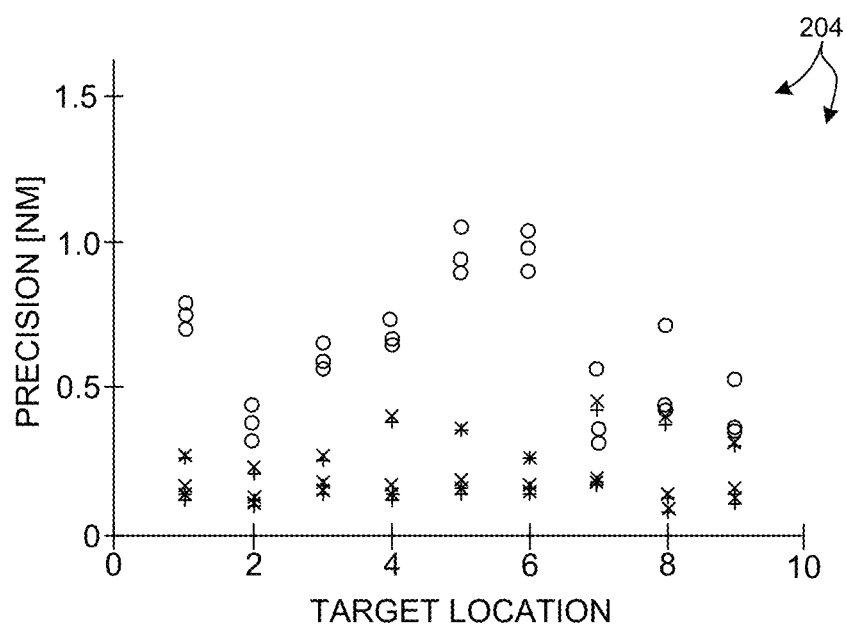
FIG. 13 depicts a plot 204 illustrative of the measurement precision achieved for each corresponding CD value depicted in FIG. 12.

FIG. 12 depicts a plot 203 of CD values estimated from SEM images at different target locations. For each collected image, an estimated value for a critical dimension, CD, is determined without feedforward of $CD_{AVG}$ (marked with a "○"), with feedforward of $CD_{AVG}$ (marked with a "+"), and with feedforward of $CD_{AVG}$ and a one nanometer systematic offset between metrology system 102 and metrology system 103 (marked with a "×"). In addition, values of the critical dimension, CD, are based on three different algorithms. Hence, three estimates values are associated with each method of estimation at each target location. FIG. 13 depicts a plot 204 of the measurement precision achieved for each corresponding CD value depicted in FIG. 12.

As depicted in FIGS. 12 and 13, a systematic metrology offset (e.g., 1 nanometer offset) between SEM system 102 and OCD system 103 shifts all SEM measurement results, but does not affect measurement precision improvements achieved with feedforward of $CD_{AVG}$. Moreover, if OCD system 103 has a smaller offset compared to SEM system 102, the offset of SEM system 102 will be improved by matching to OCD system 103. Hence, when the source of the feedforward parameter has a smaller offset compared to the receiving metrology system, parameter feedforward as described herein improves measurement precision, tool-to-tool matching, and measurement accuracy.

In some embodiments, SEM system 102 is capable of measuring ΔCD with good precision. However, the precision, tracking, and accuracy of ΔCD measurements by OCD system 103 are generally quite poor. Furthermore, OCD measurements of other parameters of interest that are correlated to ΔCD (e.g., critical dimensions of fin structures) are also negatively affected.

In a further aspect, measurement module 122 associated with SEM system 102 determines one or more delta values, such as ΔCD, ΔHeight, ΔSWA, ΔFIN_CD, pitchwalk, overlay, etc., one or more ratio values such as $Height1_{RATIO}$, $CD1_{RATIO}$, $SWA1_{RATIO}$, and $Fin\_CD1_{RATIO}$, etc., or both. In one example, SEM system 102 determines a value of ΔCD 151 and forwards the value 151 to measurement module 123 associated with OCD system 103. In turn, measurement module 123 determines a value of one or more parameters of interest 154 with higher precision by utilizing the feedforward values (i.e., delta values, ratio values, or both) as additional constraints or initial values in the regression analysis of the measured optical spectra. In one example, the value of ΔCD 151 from measurement module 122 enables measurement module 123 associated with OCD system 103 to achieve improved measurement performance for parameters of interest (e.g., SWA, FIN_CD, FIN_HT, ΔCD1, ΔCD2, etc.) that otherwise suffer from low sensitivity, correlation with other parameters, or both.

FIG. 15 depicts a plot 206 illustrative of improved OCD measurement performance for various shape parameters based on parameter feedforward from a SEM system. FIG. 15 depicts the measurement accuracy achieved by OCD system 103 for five different shape parameters. The hatched bars indicate the achieved measurement accuracy without feedforward of ΔCD. The solid bars indicate the achieved measurement accuracy with feedforward of ΔCD. In this example, SEM system 102 measures ΔCD with a precision error of 0.25 nanometers. As depicted in FIG. 15, the accuracy associated with the measurements of ΔCD1 and ΔCD2 are improved by approximately 2×.

In one example, a value of $CD_{AVG}$ 152 is first estimated by measurement module 123 associated with OCD system 103 and fed forward to measurement module 122 associated with SEM system 102. The value of $CD_{AVG}$ 152 enables measurement module 122 to improve the precision of parameters of interest 153 (e.g., ΔCD, $CD_{RATIO}$, etc.) and ensure tool-to-tool matching on CD measurements. Subsequently, a value of ΔCD 151 is estimated by measurement module 122 associated with SEM system 102 and fed back to measurement module 123 associated with OCD system 103. The value of ΔCD 151 enables measurement module 123 to improve the accuracy of OCD measurements of parameters of interest 154, particularly parameters having low sensitivity, correlation to other parameters, or both. By feeding forward a value of $CD_{AVG}$ 152 before feeding back a value of ΔCD 151, better measurement precision and less systematic offset to the value of ΔCD 151 is achieved. A higher precision value of ΔCD 151 reduces OCD regression analysis time and results in higher precision estimates of parameters of interest 154. In addition, reduced systematic offset enabled efficient OCD regression analysis. In this manner, a sequential feed forward and feedback exchange of parameters between two different metrology systems improves the measurement performance of both metrology systems for different parameters of interest.

In another example, a value of ΔCD 151 is first estimated by measurement module 122 associated with SEM system 102 and fed forward to measurement module 123 associated with OCD system 103. The value of ΔCD 151 enables measurement module 123 to improve the precision of parameters of interest 154 and an improved estimate of a value of $CD_{AVG}$ 152. Subsequently, the value of $CD_{AVG}$ 152 is fed back to measurement module 122 associated with SEM system 102. The value of $CD_{AVG}$ 152 enables measurement module 122 to improve the accuracy of SEM measurements of parameters of interest 153 (e.g., ΔCD, $CD_{RATIO}$ etc.). In this manner, a sequential feed forward and feedback exchange of parameters between two different metrology systems improves the measurement performance of both metrology systems for different parameters of interest.

In the examples described with reference to FIG. 4, parameter values are directly fed forward or backward. However, in another aspect, parameter values estimated by one metrology technique are re-parameterized before being utilized by the second metrology technique.

Figure 5:
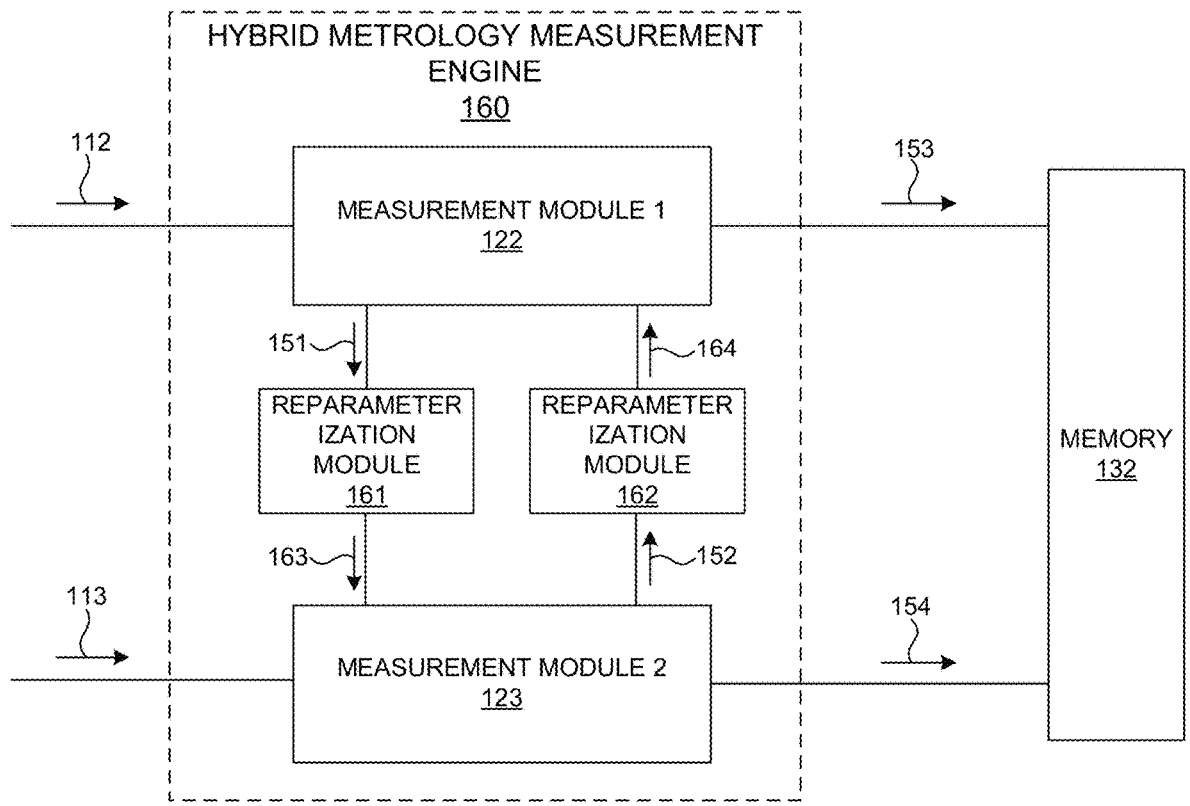
FIG. 5 depicts a hybrid metrology measurement engine 160 in another embodiment.

FIG. 5 depicts a hybrid metrology measurement engine 160 in another embodiment. Elements having the same reference numbers described with reference to FIG. 4 are analogous. As depicted in FIG. 5, values 151 are reparameterized by reparameterization module 161. The reparameterized values 163 are communicated to measurement module 123. Similarly, values 152 are reparameterized by reparameterization module 162. The reparameterized values 164 are communicated to measurement module 122.

In one example, CD1, CD2 and CD3 of semiconductor structure 20 depicted in FIG. 2 are first measured by SEM system 102. Then CD1, CD2, and CD3 are re-parametrized into ratio values as illustrated in equation (3).

$$\Delta CD1_{Ratio} = \frac{3CD1 - 2CD2 - CD3}{CD1 + 2CD2 + CD3} \qquad (3)$$

$$\Delta CD2_{Ratio} = \frac{2CD2 - CD1 - CD3}{CD1 + 2CD2 + CD3}$$

$$\Delta CD3_{Ratio} = \frac{3CD3 - 2CD2 - CD1}{CD1 + 2CD2 + CD3}$$

By definition, the three ratio values are related to one another by equation (4).

$$\Delta CD1_{Ratio} + 2\Delta CD2_{Ratio} + \Delta CD3_{Ratio} = 1 \qquad (4)$$

The three ratio values of equation (3) are fed forward to measurement module 103 associated with OCD system 103. In response measurement module 103 is configured to generate three constraints on the parameter space based on the three ratio values. The three constraints are illustrated in equation (5)

$$CD1 = CD_{AVG}(1 + \Delta CD1_{Ratio})$$

$$CD2 = CD_{AVG}(1 + \Delta CD2_{Ratio})$$

$$CD3 = CD_{AVG}(1 + \Delta CD3_{Ratio}) \quad (5)$$

In general, additional constraints on the parameter space improve OCD measurement performance for insensitive parameters (e.g., CD1, CD2 and CD3) and correlated parameters (e.g., FIN_HT). Moreover, regression analysis time in OCD is reduced.

In another aspect, parameter values estimated by one metrology technique are transformed before being utilized by the second metrology technique.

Figure 6:
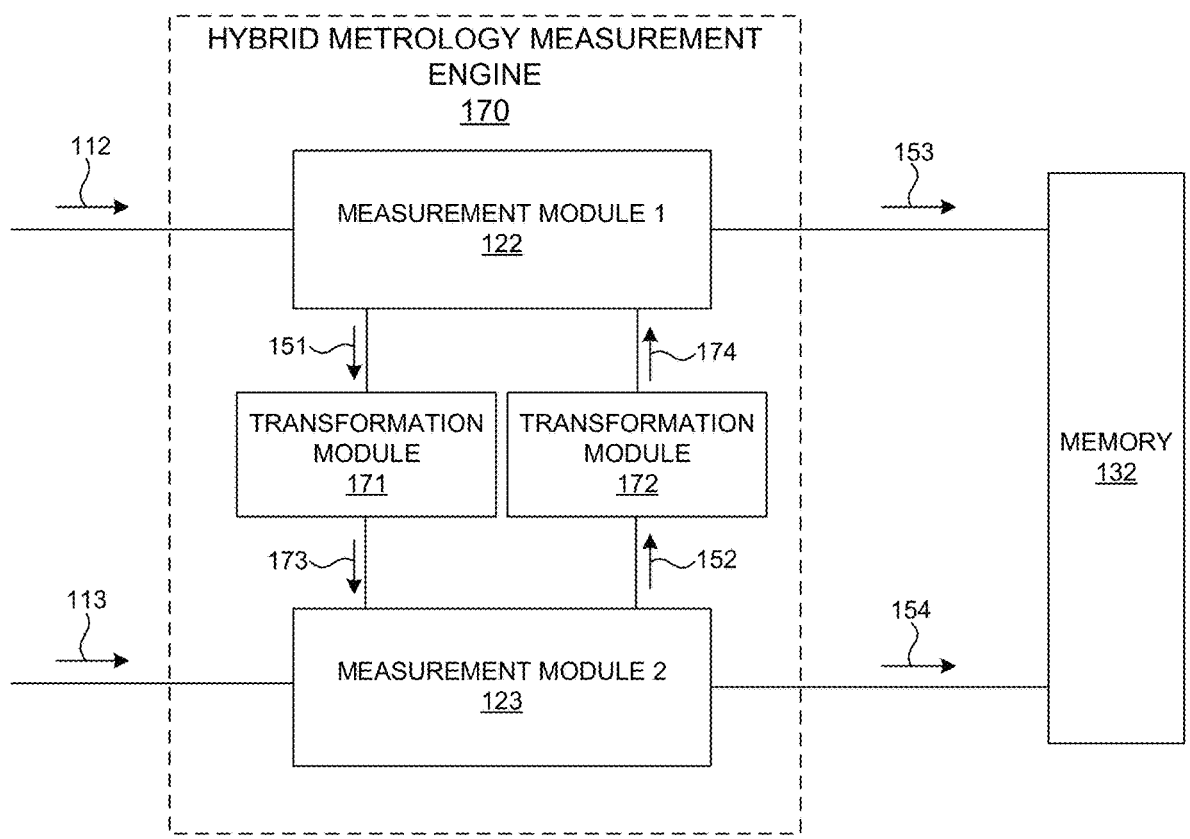
FIG. 6 depicts a hybrid metrology measurement engine 170 in another embodiment.

FIG. 6 depicts a hybrid metrology measurement engine 170 in another embodiment. Elements having the same reference numbers described with reference to FIG. 4 are analogous. As depicted in FIG. 6, values 151 are transformed by transformation module 171. The transformed values 173 are communicated to measurement module 123. Similarly, values 152 are transformed by transformation module 172. The transformed values 174 are communicated to measurement module 122.

Transformation modules 171 and 172 may include one or more data fitting and optimization techniques (e.g., fast reduced-order models; regression; machine-learning algorithms such as neural networks and support-vector machines; dimensionality reduction algorithms such as principal component analysis and independent component analysis, and local-linear embedding; sparse representation algorithms such as Fourier transforms, wavelet transforms; and Kalman filters. In one example, a systematic offset in a hybrid metrology system including an OCD metrology system and a SEM metrology system is eliminated by transformation modules 171, 172, or both. In one example, transformation module 171, 172, or both, include a trained transformation model. The transformation model is trained based on reference measurements from a trusted reference metrology system (e.g., a cross-section SEM or TEM) to eliminate the systematic offset.

In general, a hybrid metrology system may include any number of metrology systems and measurement results from any one of the metrology systems may be fed forward to any of the other metrology systems. Similarly, measurement results obtained by any of the metrology systems based on one or more parameter values fed forward from another metrology system may be fed back to the originating metrology system(s).

Figure 7:
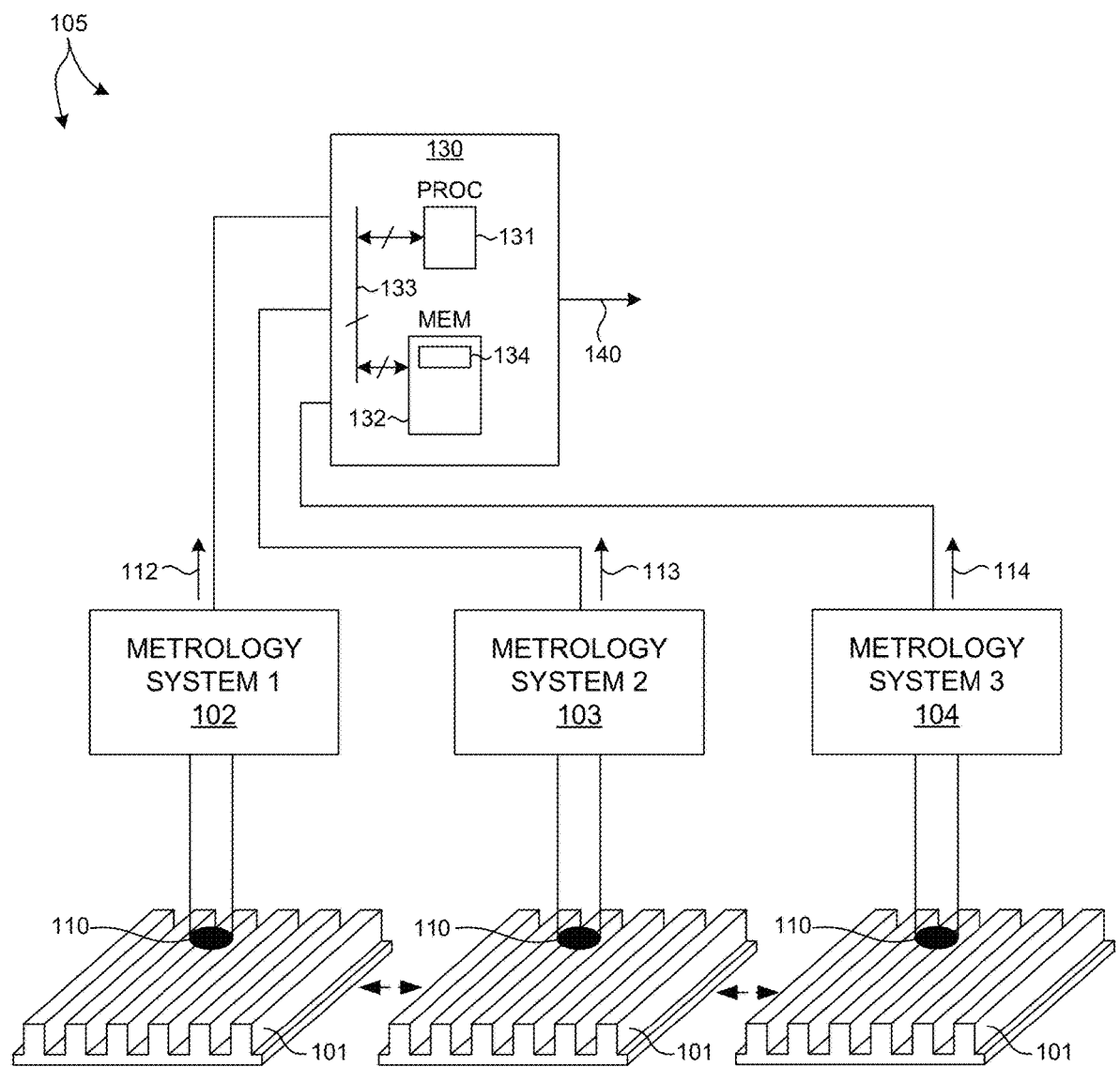
FIG. 7 depicts a hybrid metrology system 105 including three metrology systems.

FIG. 7 depicts a hybrid metrology system 105 including three metrology systems. Elements having reference numbers described with reference to FIG. 3 are analogous. As depicted in FIG. 7, hybrid metrology system 105 includes a third metrology system 104. Measurement signals generated by metrology system 104 are communicated to computing system 130 for analysis. In the embodiment depicted in FIG. 7, computing system 130 is configured as a hybrid metrology measurement engine employed to estimate values of multiple, different parameters of interest based on measurements of target structures by three metrology systems.

Figure 8:
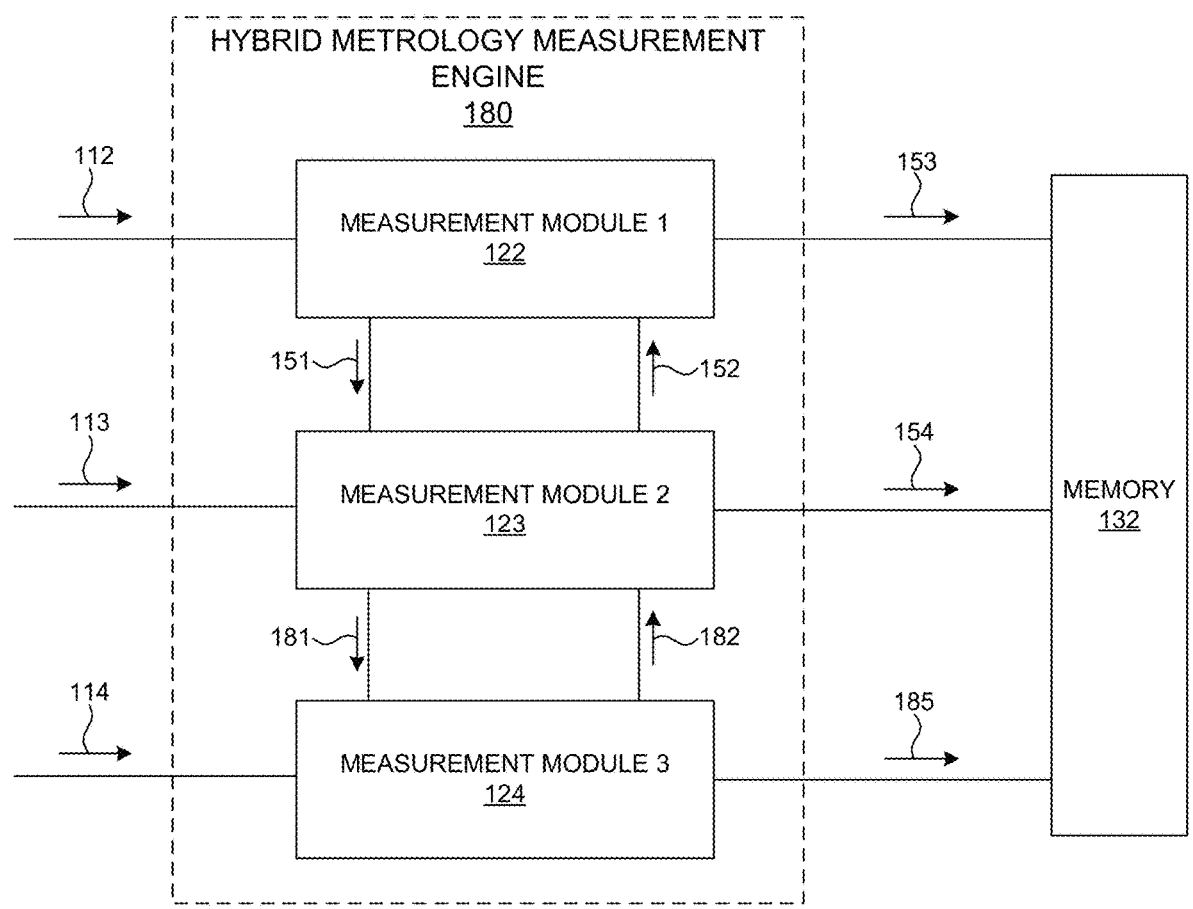
FIG. 8 is a diagram illustrative of an exemplary hybrid metrology measurement engine 180 in another embodiment.

FIG. 8 is a diagram illustrative of an exemplary hybrid metrology measurement engine 180 in another embodiment. As depicted in FIG. 8, hybrid metrology measurement engine 180 includes three different measurement modules 122, 123, and 124, associated with metrology systems 102, 103, and 104, respectively. As depicted in FIG. 8, measurement results 181 obtained by measurement module 123 are communicated to measurement module 124 to improve the estimation of values 185 of one or more parameters of interest associated with the measurement of metrology structure 101 by metrology system 104. This may be referred to as a "feedforward" communication of values 181 to measurement module 124. Similarly, measurement results 182 obtained by measurement module 124 are communicated to measurement module 123 to improve the estimation of values 154 of one or more parameters of interest associated with the measurement of metrology structure 101 by metrology system 103. This may be referred to as a "feedback" communication of values 182 to measurement module 123.

In one example, metrology system 102 is a SEM system, metrology system 103 is an OCD system, and metrology system 104 is an AFM system. In this example, measurement module 123 associated with OCD system 103 estimates values of AverageDepth and AverageLinewidth of structure 101 with high precision. These values of both of these parameters are communicated to measurement module 122 and measurement module 124 as measurement signals 152 and 181, respectively. Values 152 and 181 improve the measurement precision of parameters of interest 153 and 185 estimated by measurement module 122 and 124, respectively. In addition, values 152 and 181 improve tool-to-tool offset matching. After estimation of parameters of interest 153 and 185 by measurement modules 122 and 124, respectively, improved values of ΔDepth and ΔLinewidth are estimated by measurement module 122, 124, or both. The improved values are fed back to measurement module 123 as measurement signals 152 from measurement module 122 and measurement signals 181 from measurement module 124. Measurement module 123 estimates parameters of interest 154 (e.g., FIN_CD, SWA, etc.) based on the improved values. The improved values improve the measurement performance of OCD measurement module 123 for the parameters of interest 154 that is otherwise limited by low sensitivity, correlation with other parameters, or both.

In another aspect, the hybrid metrology systems and methods described herein may be applied to multiple targets. Very often, certain metrology techniques are only able to characterize certain targets. For example, optical metrology is typically capable of measuring periodic scribe-line targets but not random, in-die targets. However, SEM is typically capable of measuring in-die targets.

In one example, a metrology target located on a wafer scribe line is first measured by OCD system 103 and SEM system 103, separately. Subsequently, in-die targets are measured by SEM system 103.

Figure 9:
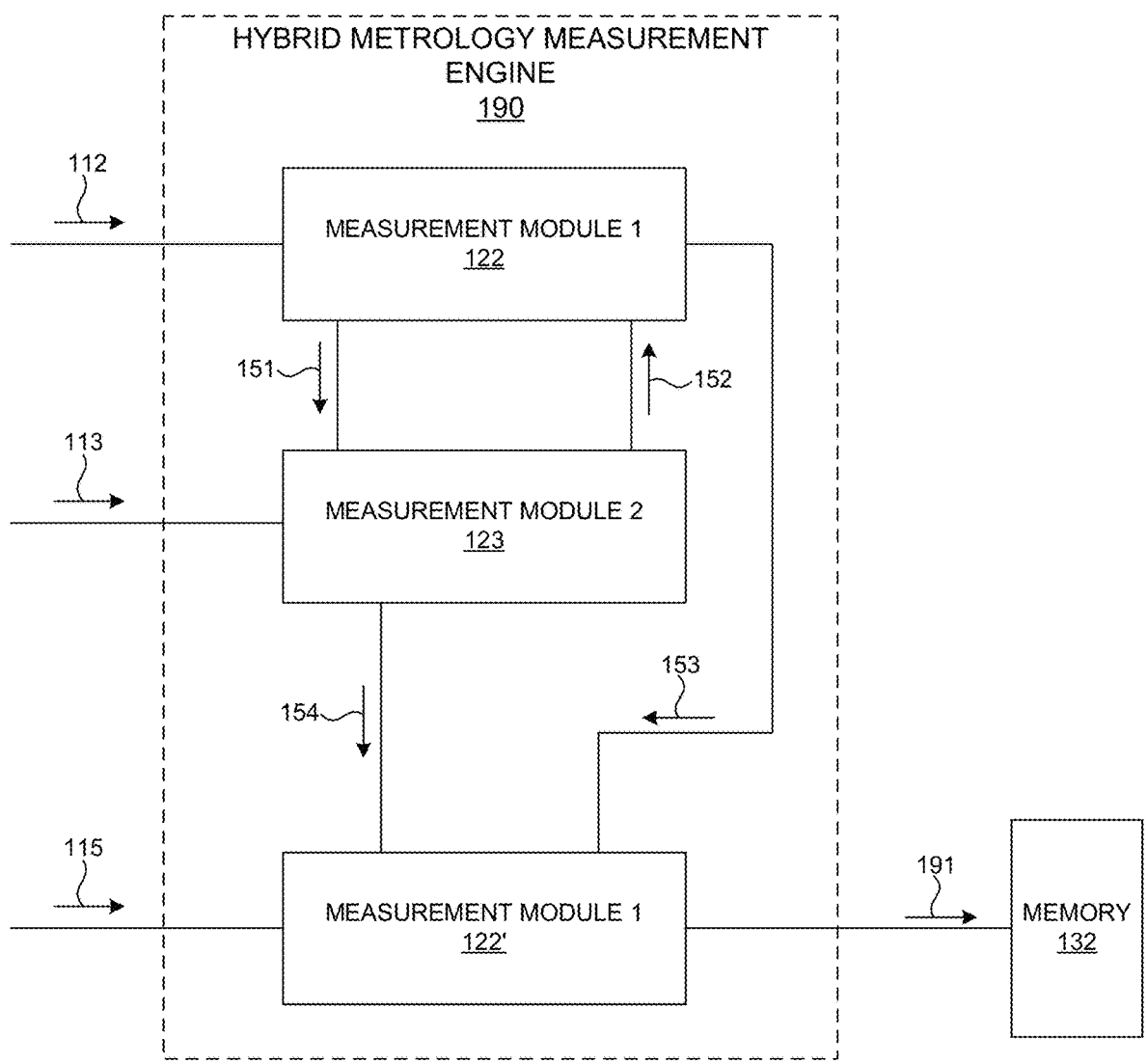
FIG. 9 is a diagram illustrative of an exemplary hybrid metrology measurement engine 190 in another embodiment.

FIG. 9 is a diagram illustrative of an exemplary hybrid metrology measurement engine 190 in another embodiment. As depicted in FIG. 9, hybrid metrology measurement engine 190 includes measurement module 123 associated with OCD system 102 and two instances of measurement module 122 (122 and 122') associated with SEM system 102. As depicted in FIG. 9, a value of $CD_{AVG\text{-}OCD}$ 154 is estimated by measurement module 123 based on measurements of the scribe line target by OCD system 103. Similarly, a value of $CD_{AVG\text{-}SEM}$ 153 is estimated by measurement module 122 based on measurements of the scribe line target by SEM system 102. Measurement module 122' receives these values along with the SEM measurement data 115 associated with a measurement of the in-die target by SEM system 102. Measurement module 122' estimates a CD value associated with the in-die target, $CD_{IN-DIE}$. In addition, measurement module 122' determines a normalized value 191 of the measured CD value, $CD_{CORRECTED}$, based on $CD_{AVG-SEM}$ 153 and $CD_{AVG-OCD}$ 154 as described by equation (6).

$$CD_{CORRECTED} = CD_{IN-DIE}\left(\frac{CD_{AVG-OCD}}{CD_{AVG-SEM}}\right) \quad (6)$$

If the scribe line targets and the in-die targets share a very similar profile (e.g., similar SWA, trench depth, etc.), SEM measurement performance on the in-die targets will be improved.

In general, the hybrid metrology techniques described herein may enhance measurement performance on single-patterned targets, all types of double patterning lithography targets (e.g., LELE, LEFE and SADP), and more complex multiple patterning targets (such as LELELE, SAQP, or SAOP). The targets may be fabricated with 193 nanometer immersion lithography, extreme ultraviolet lithography (EUV), or a combination thereof. The hybrid metrology techniques described herein may be especially useful for the characterization of targets manufactured by EUV lithography, as these targets generally have thinner resist layers and suffer lower sensitivity for optical measurements.

In general, hybrid metrology techniques as described herein may improve computational speed for regression calculations and reduce library generation time for model based metrologies, such as OCD. In some examples, regression convergence is more reliable and less computationally intensive when using more accurate initial values, additional constraints, or both. This reduces the overall regression analysis time for OCD spectra.

Figure 16:
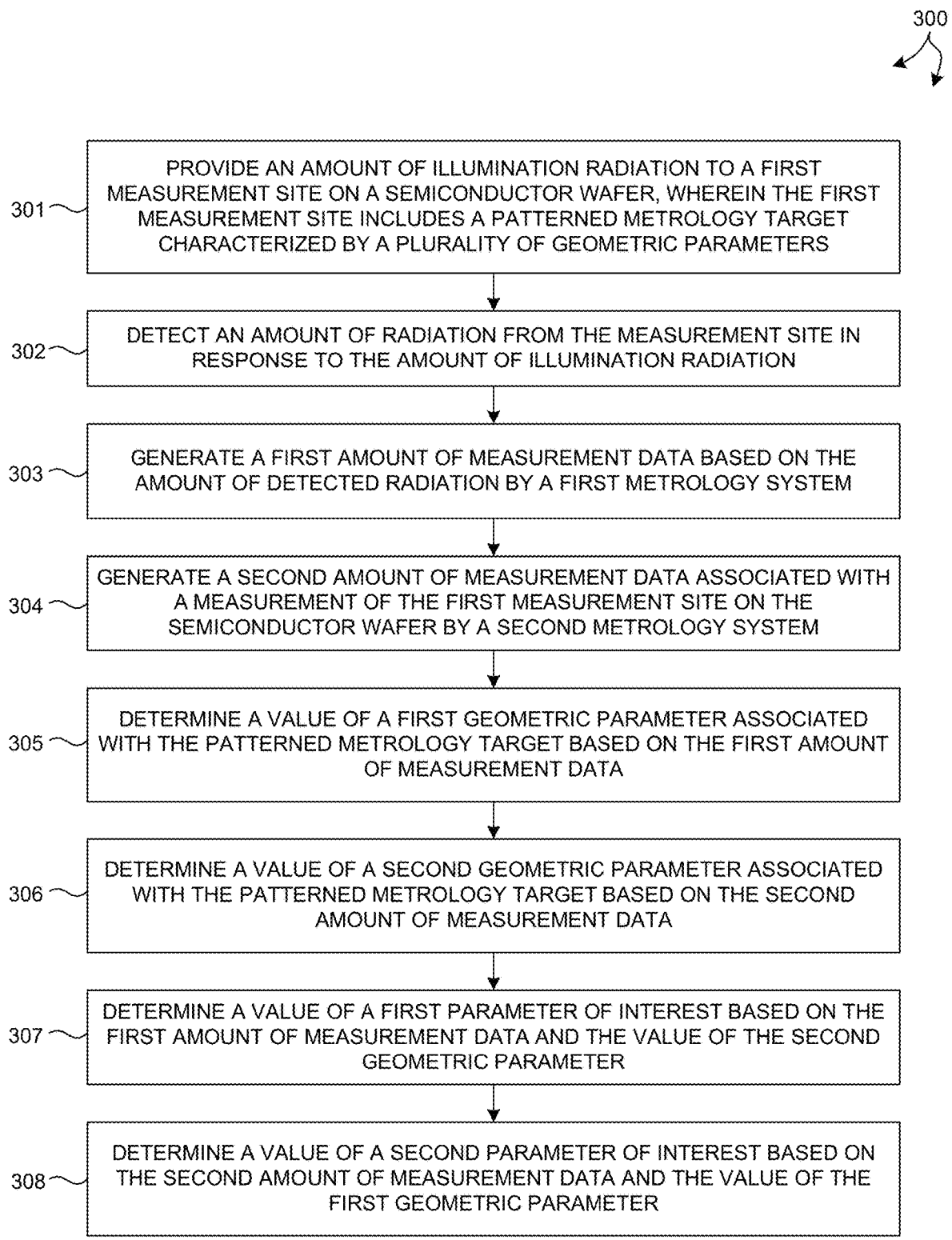
FIG. 16 is a flowchart illustrative of a method 300 of measurement of geometric errors induced by a multiple patterning process.

FIG. 16 illustrates a method 300 suitable for implementation by a hybrid metrology system such as hybrid metrology systems 100 and 105 illustrated in FIGS. 3 and 7, respectively, of the present invention. In one aspect, it is recognized that data processing blocks of method 300 may be carried out via a pre-programmed algorithm executed by one or more processors of computing system 130, or any other general purpose computing system. It is recognized herein that the particular structural aspects of metrology systems 100 and 105 do not represent limitations and should be interpreted as illustrative only.

In block 301, an amount of illumination radiation is provided to a first measurement site on a semiconductor wafer. The first measurement site includes a patterned metrology target characterized by a plurality of geometric parameters.

In block 302, an amount of radiation is detected from the measurement site in response to the amount of illumination radiation.

In block 303, a first amount of measurement data is generated by a first metrology system based on the amount of detected radiation.

In block 304, a second amount of measurement data associated with a measurement of the first measurement site on the semiconductor wafer is generated by a second metrology system.

In block 305, a value of a first geometric parameter associated with the patterned metrology target is determined based on the first amount of measurement data.

In block 306, a value of a second geometric parameter associated with the patterned metrology target is generated based on the second amount of measurement data.

In block 307, a value of a first parameter of interest is determine based on the first amount of measurement data and the value of the second geometric parameter.

In block 308, a value of a second parameter of interest is determined based on the second amount of measurement data and the value of the first geometric parameter.

Figure 17:
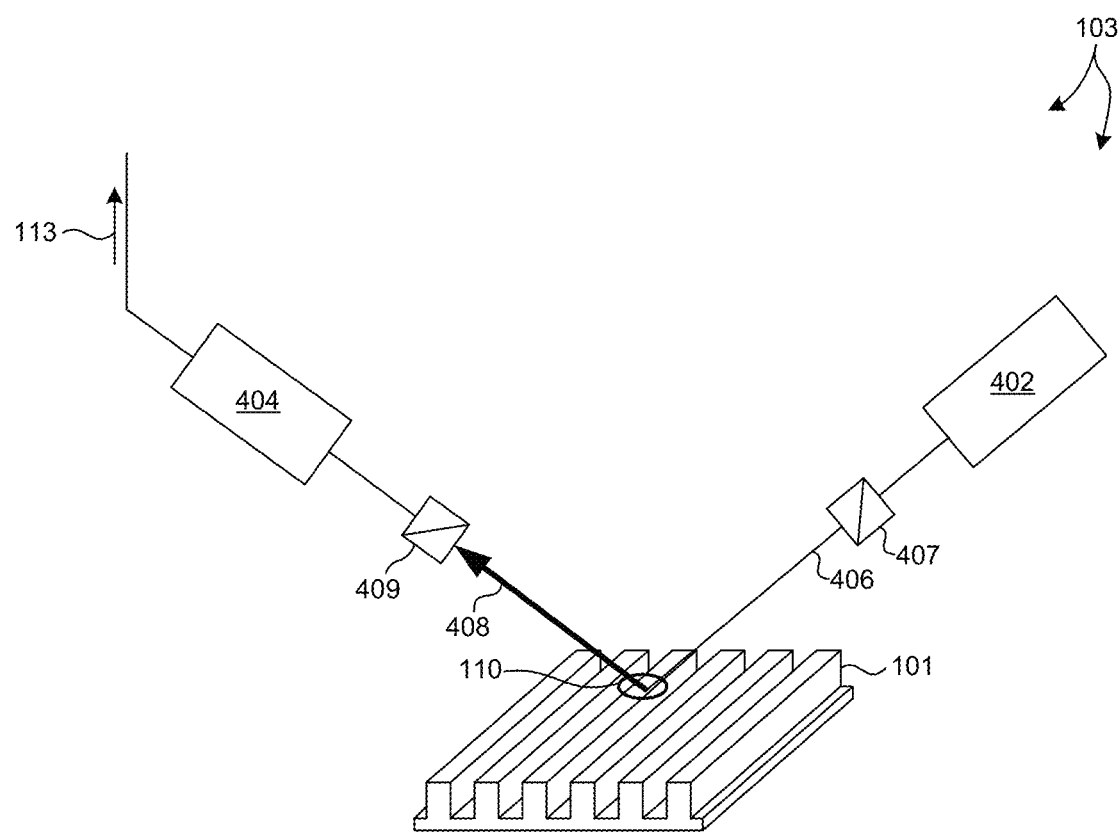
FIG. 17 illustrates an optical metrology system 103 for measuring characteristics of a specimen in accordance with the exemplary methods presented herein.

FIG. 17 illustrates an embodiment of an optical metrology system 103 for measuring characteristics of a specimen in accordance with the exemplary methods presented herein. As shown in FIG. 17, the system 103 may be used to perform spectroscopic ellipsometry measurements over a measurement spot 110 of a metrology target 101. In this aspect, the system 103 may include a spectroscopic ellipsometer equipped with an illuminator 402 and a spectrometer 404. The illuminator 402 of the system 103 is configured to generate and direct illumination of a selected wavelength range (e.g., 150-2000 nm) to the measurement spot 110 of the metrology target 101. In turn, the spectrometer 404 is configured to receive illumination reflected from the measurement spot 110. It is further noted that the light emerging from the illuminator 402 is polarized using a polarization state generator 407 to produce a polarized illumination beam 406. The radiation reflected by the structures of the metrology target 101 is passed through a polarization state analyzer 409 and to the spectrometer 404. The radiation received by the spectrometer 404 in the collection beam 408 is analyzed with regard to polarization state, allowing for spectral analysis by the spectrometer of radiation passed by the analyzer. These spectra 113 are passed to the computing system 130 for analysis of the structure as described herein.

As depicted in FIG. 17, system 103 includes a single measurement technology (i.e., SE). However, in general, system 103 may include any number of different measurement technologies. By way of non-limiting example, system 103 may be configured as a spectroscopic ellipsometer (including Mueller matrix ellipsometry), a spectroscopic reflectometer, a spectroscopic scatterometer, an overlay scatterometer, an angular resolved beam profile reflectometer, a polarization resolved beam profile reflectometer, a beam profile reflectometer, a beam profile ellipsometer, any single or multiple wavelength ellipsometer, or any combination thereof. Furthermore, in general, measurement data collected by different measurement technologies and analyzed in accordance with the methods described herein may be collected from multiple tools, rather than one tool integrating multiple technologies.

In a further embodiment, metrology systems 100 and 105 include one or more computing systems 130 employed to perform measurements in accordance with the methods described herein. The one or more computing systems 130 may be communicatively coupled to each metrology system (e.g., spectrometer 404). In one aspect, the one or more computing systems 130 are configured to receive measurement data 112, 113, and 114 associated with measurements of one or more metrology targets.

It should be recognized that the various steps described throughout the present disclosure may be carried out by a single computer system 130 or, alternatively, a multiple computer system 130. Moreover, different subsystems of the systems 100 and 105, such as the spectroscopic ellipsometer 404, may include a computer system suitable for carrying out at least a portion of the steps described herein. Therefore, the aforementioned description should not be interpreted as a limitation on the present invention but merely an illustration. Further, the one or more computing systems 130 may be configured to perform any other step(s) of any of the method embodiments described herein.

In addition, the computer system 130 may be communicatively coupled to the metrology systems in any manner known in the art. For example, the one or more computing systems 130 may be coupled to computing systems associated with the spectrometer 404. In another example, the spectrometer 404 may be controlled directly by a single computer system coupled to computer system 130.

The computer system 130 of the metrology systems 100 and 105 may be configured to receive and/or acquire data or information from the metrology systems (e.g., spectrometer 404 and the like) by a transmission medium that may include wireline and/or wireless portions. In this manner, the transmission medium may serve as a data link between the computer system 130 and other subsystems of the metrology systems.

Computer system 130 of the hybrid metrology systems 100 and 105 may be configured to receive and/or acquire data or information (e.g., measurement results, modeling inputs, modeling results, etc.) from other systems by a transmission medium that may include wireline and/or wireless portions. In this manner, the transmission medium may serve as a data link between the computer system 130 and other systems (e.g., memory on-board metrology systems 100 and 105, external memory, a reference measurement source, or other external systems). For example, the computing system 130 may be configured to receive measurement data from a storage medium (i.e., memory 132 or an external memory) via a data link. For instance, spectral results obtained using spectrometer 404 may be stored in a permanent or semi-permanent memory device (e.g., memory 132 or an external memory). In this regard, the spectral results may be imported from on-board memory or from an external memory system. Moreover, the computer system 130 may send data to other systems via a transmission medium. For instance, a hybrid measurement model or a structural parameter value 140 determined by computer system 130 may be communicated and stored in an external memory. In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIGS. 3 and 7, program instructions 134 stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

In general, any measurement technique, or combination of two or more measurement techniques may be contemplated within the scope of this patent document. Exemplary measurement techniques include, but are not limited to spectroscopic ellipsometry, including Mueller matrix ellipsometry, spectroscopic reflectometry, spectroscopic scatterometry, scatterometry overlay, beam profile reflectometry, both angle-resolved and polarization-resolved, beam profile ellipsometry, single or multiple discrete wavelength ellipsometry, transmission small angle x-ray scatterometer (TSAXS), small angle x-ray scattering (SAXS), grazing incidence small angle x-ray scattering (GISAXS), wide angle x-ray scattering (WARS), x-ray reflectivity (XRR), x-ray diffraction (XRD), grazing incidence x-ray diffraction (GIXRD), high resolution x-ray diffraction (HRXRD), x-ray photoelectron spectroscopy (XPS), x-ray fluorescence (XRF), grazing incidence x-ray fluorescence (GIXRF), low-energy electron induced x-ray emission scatterometry (LEXES), x-ray tomography, and x-ray ellipsometry. In general, any metrology technique applicable to the characterization of semiconductor structures, including image based metrology techniques, may be contemplated. Additional sensor options include electrical sensors such as non-contact capacitance/voltage or current/voltage sensors which bias the device and detect the resulting bias with an optical sensor (or the converse), or assisted optical techniques, such as XRD, XRF, XPS, LEXES, SAXS, and pump probe techniques. In one embodiment a two-dimensional beam profile reflectometer (pupil imager) may be used to collect both angle resolved and/or multi-spectral data in a small spot size. A UV Linnik interferometer may also be used as a Mueller matrix spectral pupil imager.

In some examples, the hybrid metrology measurement methods described herein are implemented as an element of a SpectraShape® optical critical-dimension metrology system available from KLA-Tencor Corporation, Milpitas, Calif., USA. In this manner, measurement models are created and ready for use immediately after the wafer spectra are collected by the system.

In some other examples, the hybrid metrology measurement methods described herein are implemented off-line, for example, by a computing system implementing AcuShape® software available from KLA-Tencor Corporation, Milpitas, Calif., USA. The resulting model may be incorporated as an element of an AcuShape® library that is accessible by a hybrid metrology system performing measurements.

In another example, the methods and systems described herein may be applied to overlay metrology. Grating measurements are particularly relevant to the measurement of overlay. The objective of overlay metrology is to determine shifts between different lithographic exposure steps. Performing overlay metrology on-device is difficult due to the small size of on-device structures, and the typically small overlay value.

For example, the pitch of typical scribe line overlay metrology structures varies from 200 nanometers to 2,000 nanometers. But, the pitch of on-device, overlay metrology structures is typically 100 nanometers or less. In addition, in a nominal production environment, the device overlay is only a small fraction of the periodicity of the device structure. In contrast, proxy metrology structures used in scatterometry overlay are frequently offset at larger values, e.g., quarter of the pitch, to enhance signal sensitivity to overlay.

Under these conditions, overlay metrology is performed with sensor architectures having sufficient sensitivity to small offset, small pitch overlay. The methods and systems described herein may be employed to obtain a measurement signal sensitive to overlay based on on-device structures, proxy structures, or both.

In general, the methods and systems for performing semiconductor metrology presented herein may be applied directly to actual device structures or to dedicated metrology targets (e.g., proxy structures) located in-die or within scribe lines.

In yet another aspect, the measurement techniques described herein can be used to provide active feedback to a process tool (e.g., lithography tool, etch tool, deposition tool, etc.). For example, values of the structural parameters determined using the methods described herein can be communicated to a lithography tool to adjust the lithography system to achieve a desired output. In a similar way etch parameters (e.g., etch time, diffusivity, etc.) or deposition parameters (e.g., time, concentration, etc.) may be included in a measurement model to provide active feedback to etch tools or deposition tools, respectively.

In general, the systems and methods described herein can be implemented as part of a dedicated metrology tool, or alternatively implemented as part of a process tool (e.g., lithography tool, etch tool, etc.).

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including measurement applications such as critical dimension metrology, overlay metrology, focus/dosage metrology, and composition metrology. However, such terms of art do not limit the scope of the term "metrology system" as described herein. In addition, a metrology system may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the methods and systems described herein.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A hybrid metrology system comprising:
   a first metrology system configured to generate a first amount of measurement data associated with a first measurement site on a semiconductor wafer, wherein the first measurement site includes a patterned metrology target characterized by a plurality of geometric parameters;
   a second metrology system different from the first metrology system, wherein the second metrology system generates a second amount of measurement data associated with a measurement of the first measurement site on the semiconductor wafer; and a computing system configured to:
  determine a value of a first geometric parameter associated with the patterned metrology target based on the first amount of measurement data;
  determine a value of a second geometric parameter associated with the patterned metrology target based on the second amount of measurement data;
  determine a value of a first parameter of interest based on the first amount of measurement data and the value of the second geometric parameter; and
  determine a value of a second parameter of interest based on the second amount of measurement data and the value of the first geometric parameter; and
  store the values of the first and second parameters of interest in a memory.

2. The hybrid metrology system of claim 1, wherein the second metrology system is any of a scanning electron microscopy (SEM) system, a transmission electron microscopy (TEM) system, an atomic force microscopy (AFM) system, and an x-ray based metrology system.

3. The hybrid metrology system of claim 1, further comprising:
  a third metrology system different from the first metrology system and the second metrology system, wherein the third metrology system generates a third amount of measurement data associated with a measurement of the first measurement site on the semiconductor wafer, wherein the computing system is further configured to:
    determine a value of a third geometric parameter associated with the patterned metrology target based on the third amount of measurement data, wherein the determining of the first parameter of interest is also based on the value of the third geometric parameter;
    determine a value of a third parameter of interest based on the third amount of measurement data and the value of the first geometric parameter; and
    store the value of the third parameter of interest in a memory.

4. The hybrid metrology system of claim 1, wherein the determining of the value of the second geometric parameter occurs subsequent to the determining of the value of the first geometric parameter and is based at least in part on the value of the first geometric parameter.

5. The hybrid metrology system of claim 1, wherein the determining of the value of a first parameter of interest occurs subsequent to the determining of the value of the second geometric parameter and is based at least in part on the value of the second geometric parameter.

6. The hybrid metrology system of claim 1, wherein the computing system is further configured to reparameterize the first geometric parameter before the determining of the value of a second parameter of interest.

7. The hybrid metrology system of claim 1, wherein the computing system is further configured to transform the value of the first geometric parameter before the determining of the value of the second parameter of interest.

8. The hybrid metrology system of claim 1, wherein the second metrology system generates a third amount of measurement data associated with a measurement of a second measurement site on the semiconductor wafer including an in-die metrology target, wherein the computing system is further configured to determine a value of a third parameter of interest based on the third amount of measurement data, and the values of the first and second geometric parameters.

9. A hybrid metrology system comprising:
  a first metrology system configured to generate a first amount of measurement data associated with a first measurement site on a semiconductor wafer, wherein the first measurement site includes a patterned metrology target characterized by a plurality of geometric parameters; and
  a second metrology system different from the first metrology system, wherein the second metrology system generates a second amount of measurement data associated with the first measurement site on the semiconductor wafer; and
  a non-transitory, computer-readable medium, comprising instructions that, when executed by a computing system, cause the computing system to:
    determine a value of a first geometric parameter associated with the patterned metrology target based on the first amount of measurement data;
    determine a value of a second geometric parameter associated with the patterned metrology target based on the second amount of measurement data;
    determine a value of a first parameter of interest based on the first amount of measurement data and the value of the second geometric parameter; and
    determine a value of a second parameter of interest based on the second amount of measurement data and the value of the first geometric parameter.

10. The hybrid metrology system of claim 9, wherein the first metrology system is an optical metrology system and the second metrology system is any of a scanning electron microscopy (SEM) system, a transmission electron microscopy (TEM) system, an atomic force microscopy (AFM) system, and an x-ray based metrology system.

11. The hybrid metrology system of claim 9, further comprising:
  a third metrology system different from the first and second metrology systems, wherein the third metrology system generates a third amount of measurement data associated with a measurement of the first measurement site on the semiconductor wafer, the non-transitory, computer-readable medium further comprising instructions that, when executed by the computing system, cause the computing system to:
    determine a value of a third geometric parameter associated with the patterned metrology target based on the third amount of measurement data, wherein the determining of the first parameter of interest is also based on the value of the third geometric parameter;
    determine a value of a third parameter of interest based on the third amount of measurement data and the value of the first geometric parameter.

12. The hybrid metrology system of claim 9, wherein the determining of the value of the second geometric parameter occurs subsequent to the determining of the value of the first geometric parameter and is based at least in part on the value of the first geometric parameter.

13. The hybrid metrology system of claim 9, wherein the determining of the value of a first parameter of interest occurs subsequent to the determining of the value of the second geometric parameter and is based at least in part on the value of the second geometric parameter.

14. The hybrid metrology system of claim 9, wherein the computing system is further configured to reparameterize the first geometric parameter before the determining of the value of a second parameter of interest.

15. The hybrid metrology system of claim 9, the non-transitory, computer-readable medium further comprising instructions that, when executed by the computing system, cause the computing system to transform the value of the first geometric parameter before the determining of the value of the second parameter of interest.

16. The hybrid metrology system of claim 9, wherein the second metrology system generates a third amount of measurement data associated with a measurement of a second measurement site on the semiconductor wafer including an in-die patterned metrology target, the non-transitory, computer-readable medium further comprising instructions that, when executed by the computing system, cause the computing system to determine a value of a third parameter of interest based on the third amount of measurement data, and the values of the first and second geometric parameters.

17. A method comprising:
providing an amount of illumination radiation to a first measurement site on a semiconductor wafer, wherein the first measurement site includes a patterned metrology target characterized by a plurality of geometric parameters;
detecting an amount of radiation from the measurement site in response to the amount of illumination radiation;
generating a first amount of measurement data based on the amount of detected radiation by a first metrology system;
generating a second amount of measurement data associated with a measurement of the first measurement site on the semiconductor wafer by a second metrology system;
determining a value of a first geometric parameter associated with the patterned metrology target based on the first amount of measurement data;
determining a value of a second geometric parameter associated with the patterned metrology target based on the second amount of measurement data;
determining a value of a first parameter of interest based on the first amount of measurement data and the value of the second geometric parameter; and
determining a value of a second parameter of interest based on the second amount of measurement data and the value of the first geometric parameter.

18. The method of claim 17, further comprising:
generating a third amount of measurement data associated with a measurement of the first measurement site on the semiconductor wafer by a third metrology system;
determining a value of a third geometric parameter associated with the patterned metrology target based on the third amount of measurement data, wherein the determining of the first parameter of interest is also based on the value of the third geometric parameter;
determining a value of a third parameter of interest based on the third amount of measurement data and the value of the first geometric parameter.

19. The method of claim 17, further comprising:
reparameterizing the first geometric parameter before the determining of the value of a second parameter of interest.

20. The method of claim 17, further comprising:
generating a third amount of measurement data associated with a measurement of a second measurement site on the semiconductor wafer including an in-die patterned metrology target; and
determining a value of a third parameter of interest based on the third amount of measurement data, and the values of the first and second geometric parameters.

* * * * *